United States Patent
Yang

(10) Patent No.: US 10,616,998 B2
(45) Date of Patent: Apr. 7, 2020

(54) CIRCUIT BOARD AND SEMICONDUCTOR PACKAGE USING THE SAME

(71) Applicant: Samsung Electronics Co., Ltd., Suwon-si, Gyeonggi-do (KR)

(72) Inventor: Seung Yeol Yang, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/922,126

(22) Filed: Mar. 15, 2018

(65) Prior Publication Data
US 2019/0053371 A1 Feb. 14, 2019

(30) Foreign Application Priority Data

Aug. 14, 2017 (KR) .................. 10-2017-0103228

(51) Int. Cl.
*H05K 1/02* (2006.01)
*H05K 1/03* (2006.01)
(Continued)

(52) U.S. Cl.
CPC ....... *H05K 1/0271* (2013.01); *H01L 21/4846* (2013.01); *H01L 23/145* (2013.01); *H01L 23/49827* (2013.01); *H01L 23/49838* (2013.01); *H05K 1/0366* (2013.01); *H05K 1/181* (2013.01); *H05K 3/0011* (2013.01); *H01L 25/0652* (2013.01); *H01L 2224/32145* (2013.01); *H01L 2224/48091* (2013.01); *H01L 2224/48227* (2013.01); *H01L 2224/73265* (2013.01); *H01L 2224/97* (2013.01); *H01L 2225/0651* (2013.01);
(Continued)

(58) Field of Classification Search
CPC .... H05K 1/0271; H05K 1/0366; H05K 1/181; H05K 3/0011; H05K 2201/029; H05K 2201/0287; H05K 2201/2009; H01L 23/49838; H01L 23/145; H01L 21/4846
See application file for complete search history.

(56) References Cited

U.S. PATENT DOCUMENTS 5,837,624 A * 11/1998 Sakaguchi ......... D03D 15/0011
 442/208
6,417,459 B1 7/2002 Kanzaki et al.
(Continued)

FOREIGN PATENT DOCUMENTS

CN 202396087 8/2012
JP 2001-207375 8/2001
(Continued)

OTHER PUBLICATIONS

Search Report and Written Opinion for corresponding Singapore Application No. 10201805407X dated Aug. 27, 2018, 9 pages.

*Primary Examiner* — Ishwarbhai B Patel
(74) *Attorney, Agent, or Firm* — Myers Bigel, P.A.

(57) ABSTRACT

A circuit board includes at least one prepreg including a fiber layer, the fiber layer being woven with a plurality of first fibers arranged in a first direction and a plurality of second fibers arranged in a second direction that is substantially perpendicular to the first direction, and a circuit layer on at least one of opposite surfaces of the at least one prepreg. The at least one prepreg has a length in the first direction greater than a length in the second direction, each of the plurality of first fibers is formed of or includes a filling yarn, and each of the plurality of second fibers is formed of or includes a warp yarn.

20 Claims, 13 Drawing Sheets

(51) Int. Cl.
  *H05K 1/11* (2006.01)
  *H01L 21/48* (2006.01)
  *H01L 23/14* (2006.01)
  *H01L 23/498* (2006.01)
  *H05K 3/00* (2006.01)
  *H05K 1/18* (2006.01)
  *H01L 25/065* (2006.01)

(52) U.S. Cl.
  CPC ............ *H01L 2225/06568* (2013.01); *H01L 2924/15311* (2013.01); *H01L 2924/181* (2013.01); *H05K 1/11* (2013.01); *H05K 2201/029* (2013.01); *H05K 2201/0287* (2013.01); *H05K 2201/2009* (2013.01)

(56) References Cited

U.S. PATENT DOCUMENTS

| | | | |
|---|---|---|---|
| 8,119,225 B2* | 2/2012 | Peng | H05K 1/0366 |
| | | | 428/209 |
| 8,871,660 B2 | 10/2014 | Yoshizaki et al. | |
| 2010/0294554 A1* | 11/2010 | Okazaki | H05K 1/0271 |
| | | | 174/261 |
| 2012/0156955 A1* | 6/2012 | Endo | C08J 5/24 |
| | | | 442/189 |
| 2013/0126219 A1* | 5/2013 | Kim | B32B 3/10 |
| | | | 174/256 |
| 2015/0027758 A1 | 1/2015 | Maeda | |
| 2016/0007452 A1* | 1/2016 | Yan | C08J 5/24 |
| | | | 442/64 |
| 2016/0105958 A1* | 4/2016 | Nakamura | H01L 23/49822 |
| | | | 361/782 |
| 2016/0219700 A1* | 7/2016 | Hamajima | C08J 5/24 |
| 2017/0064818 A1 | 3/2017 | Kim et al. | |

FOREIGN PATENT DOCUMENTS

| | | |
|---|---|---|
| JP | 2013-053303 | 3/2013 |
| JP | 2015207620 | 11/2015 |
| KR | 1020140131453 | 11/2014 |
| KR | 1020150047348 | 5/2015 |

* cited by examiner

'A'

CIRCUIT BOARD AND SEMICONDUCTOR PACKAGE USING THE SAME

CROSS-REFERENCE TO RELATED APPLICATION

This application claims benefit of Korean Patent Application No. 10-2017-0103228, filed on Aug. 14, 2017, with the Korean Intellectual Property Office, the disclosure of which is incorporated herein by reference in its entirety.

BACKGROUND

The present inventive concept relates to a circuit board and a semiconductor package using the same.

In general, semiconductor packages may be obtained by encasing semiconductor chips mounted on a printed circuit board (PCB) with an encapsulant and cutting the semiconductor chip into individual package units. Due to the difference between coefficients of thermal expansion of the PCB, the semiconductor chip, and the encapsulant, heat applied in the manufacturing process of the semiconductor package may cause warpage in the semiconductor package. Recently, as PCBs and encapsulants have reduced in thickness, a degree of warpage that may occur in the PCB may significantly increase.

SUMMARY

An aspect of the present inventive concept may provide a circuit board having reduced warpage, and a semiconductor package using the same.

According to an aspect of the present inventive concept, a circuit board may include: at least one prepreg including a fiber layer, the fiber layer being woven with a plurality of first fibers arranged in a first direction and a plurality of second fibers arranged in a second direction that is substantially perpendicular to the first direction, and a circuit layer on at least one of opposite surfaces of the at least one prepreg, in which the at least one prepreg may have a length in the first direction greater than a length in the second direction, each of the plurality of first fibers may be formed of or include a filling yarn, and each of the plurality of second fibers may be formed of or include a warp yarn.

According to an aspect of the present inventive concept, a circuit board may include: at least one first prepreg including a first fiber layer, the first fiber layer being woven with a plurality of first fibers arranged in a first direction and a plurality of second fibers arranged in a second direction that is substantially perpendicular to the first direction, at least one second prepreg including a second fiber layer, the second fiber layer being woven with a plurality of third fibers arranged in the first direction and a plurality of fourth fibers arranged in the second direction, a circuit layer on at least one of opposite surfaces of the at least one first prepreg or the at least one second prepreg, in which the at least one first prepreg or the at least one second prepreg may have a length in the first direction greater than a length in the second direction, each of the plurality of first fibers may be formed of or include a filling yarn, each of the plurality of second fibers may be formed of or include a warp yarn, each of the plurality of third fibers may be formed of or include a warp yarn, and each of the plurality of fourth fibers may be formed of or include a filling yarn.

According to an aspect of the present inventive concept, a semiconductor package may include: at least one semiconductor chip, a package substrate having a first surface and an opposite second surface, the first surface having a first region in which the at least one semiconductor chip is mounted and a second region outside the first region, and a molding encapsulating the at least one semiconductor chip on the first surface of the package substrate, in which the package substrate may include: at least one prepreg including a fiber layer, the fiber layer being woven with a plurality of first fibers arranged in a first direction and a plurality of second fibers arranged in a second direction that is substantially perpendicular to the first direction, and a circuit layer disposed on at least one of opposite surfaces of the at least one prepreg, in which each of the plurality of first fibers may be formed of or include a filling yarn, each of the plurality of second fibers may be formed of or include a warp yarn, and the first region has a shape that is elongated in the first direction.

According to an aspect of the present inventive concept, a semiconductor package may include: at least one semiconductor chip, and a package substrate having a region in which the at least one semiconductor chip is mounted, in which the package substrate includes at least one prepreg including a fiber layer, the fiber layer being woven with a plurality of first fibers each formed of or including a filling yarn and a plurality of second fibers each formed of or including a warp yarn, and the region in which the at least one semiconductor chip is mounted may have a shape that is elongated in a length direction of the plurality of first fibers.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Hereinafter, example embodiments of the present inventive concept will be described in detail with reference to the attached drawings. As used herein the expression "and/or" includes any and all combinations of one or more of the associated listed items.

Figure 1:
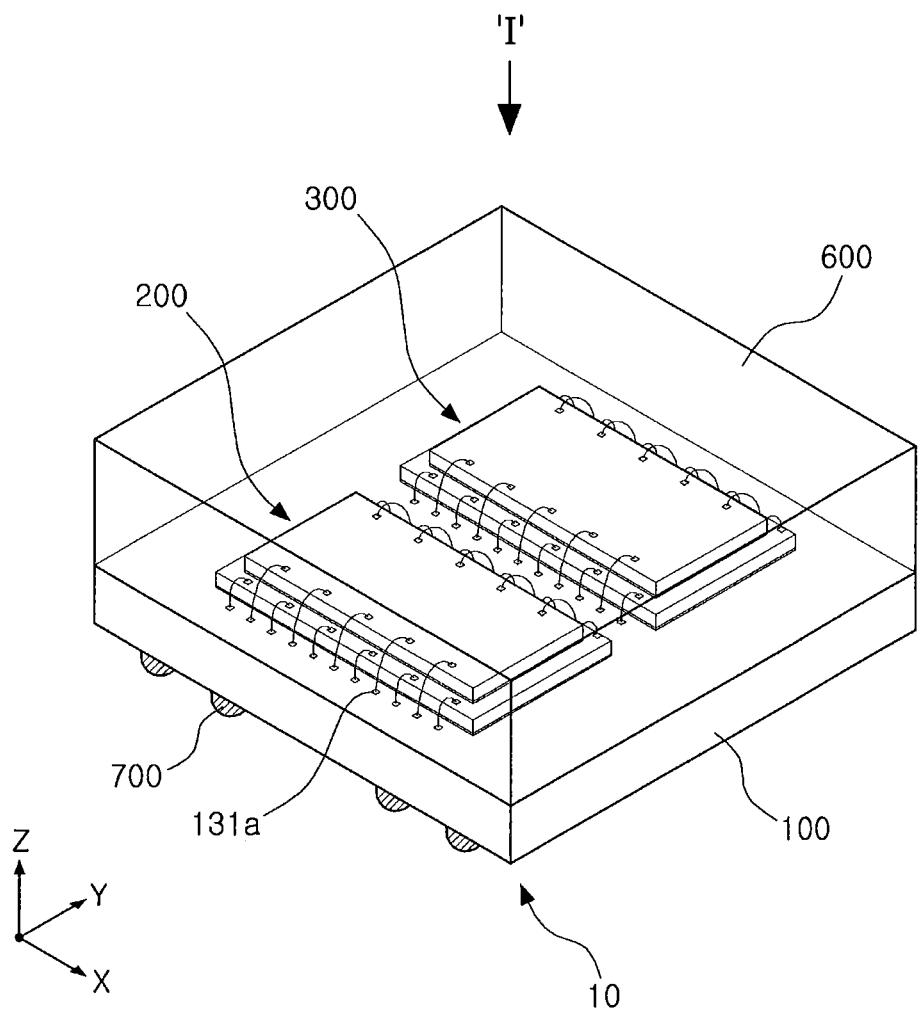
FIG. 1 is a schematic perspective view of a semiconductor package, according to an example embodiment.
Figure 2:
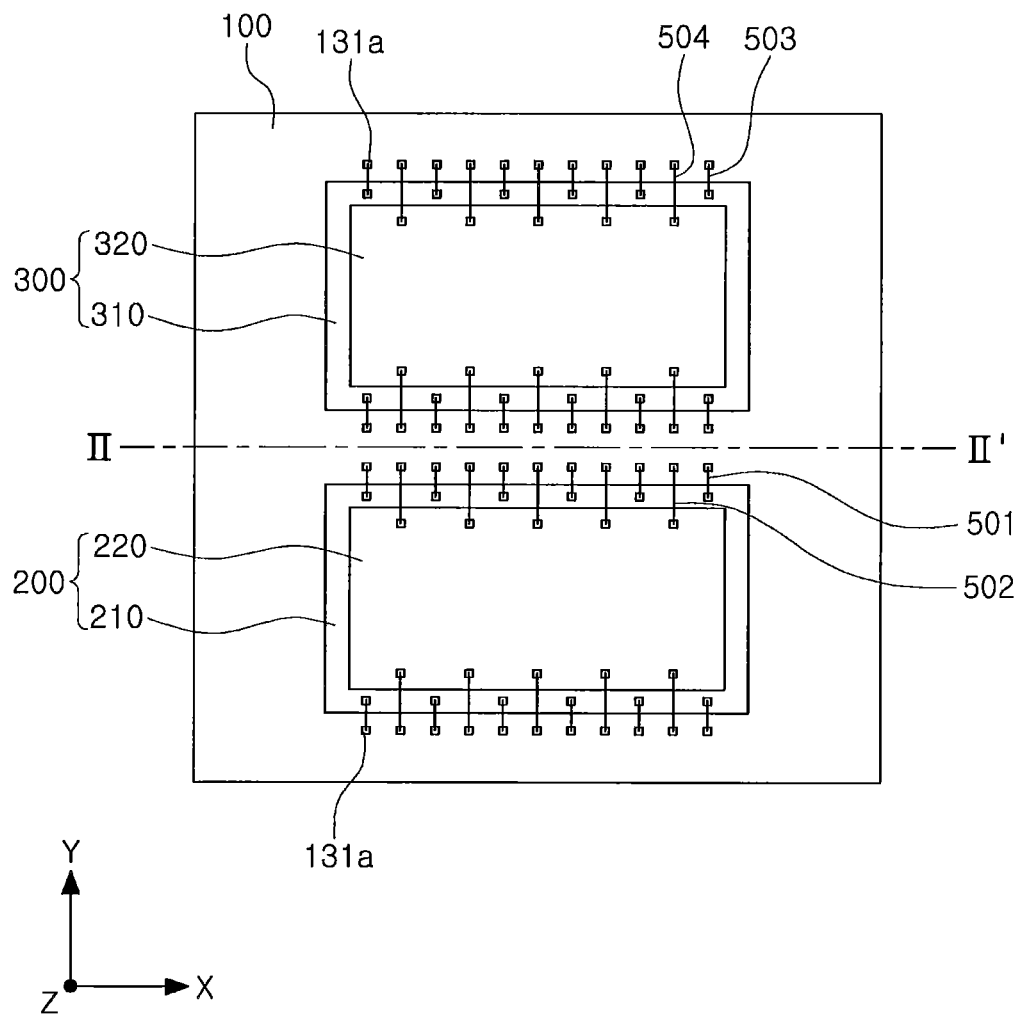
FIG. 2 is a projected plan view of the semiconductor package in direction I of FIG. 1.
Figure 3:
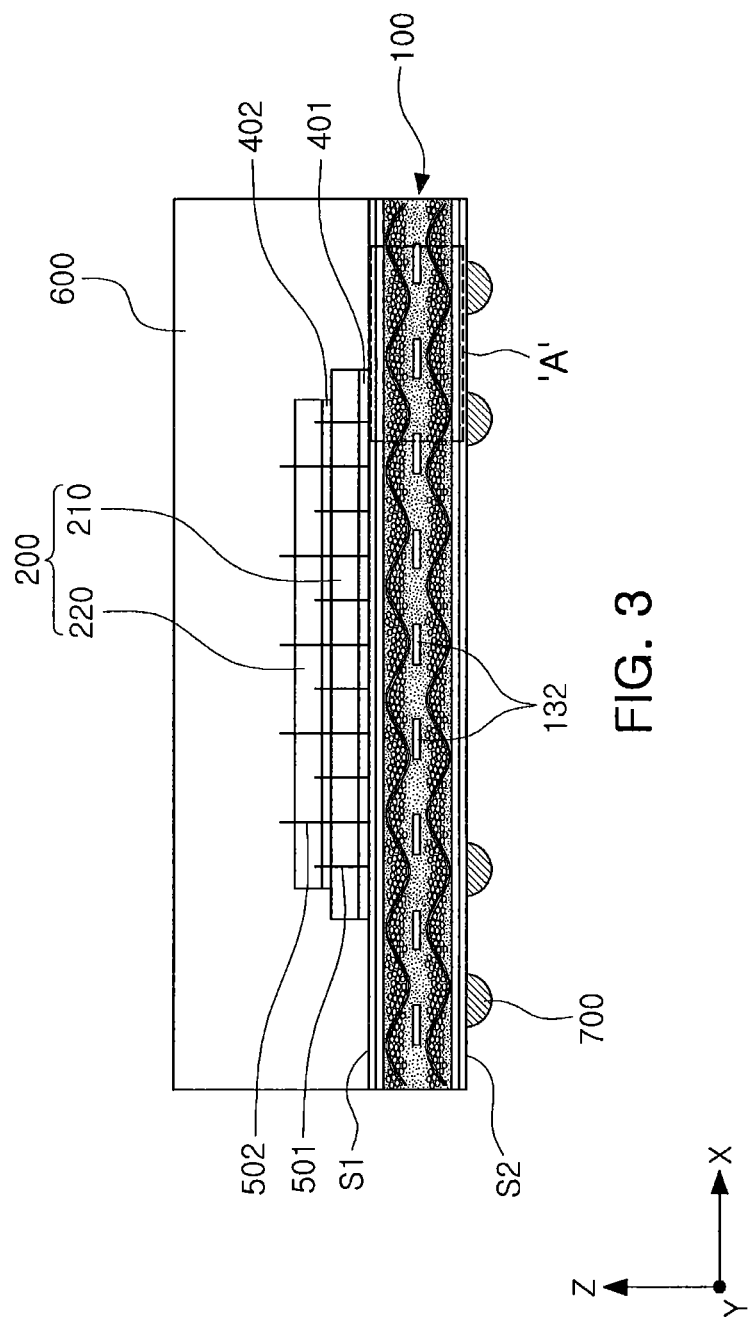
FIG. 3 is a cross-sectional view taken along line II-II' of FIG. 2.
Figure 4:
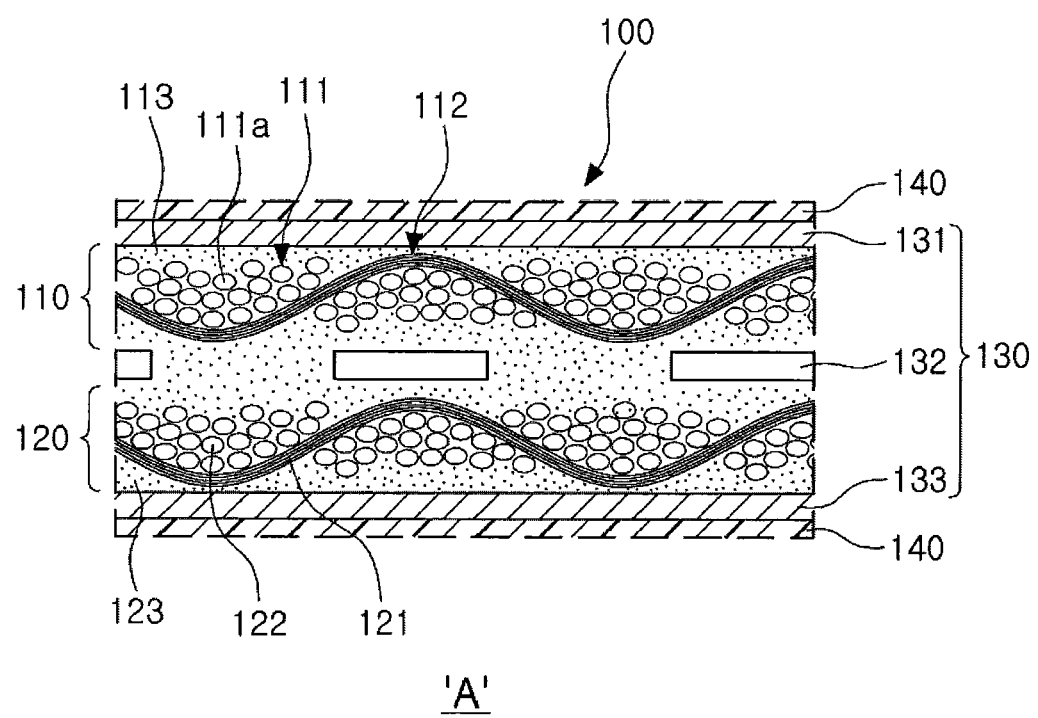
FIG. 4 is an enlarged view of area A of FIG. 3.
Figure 5:
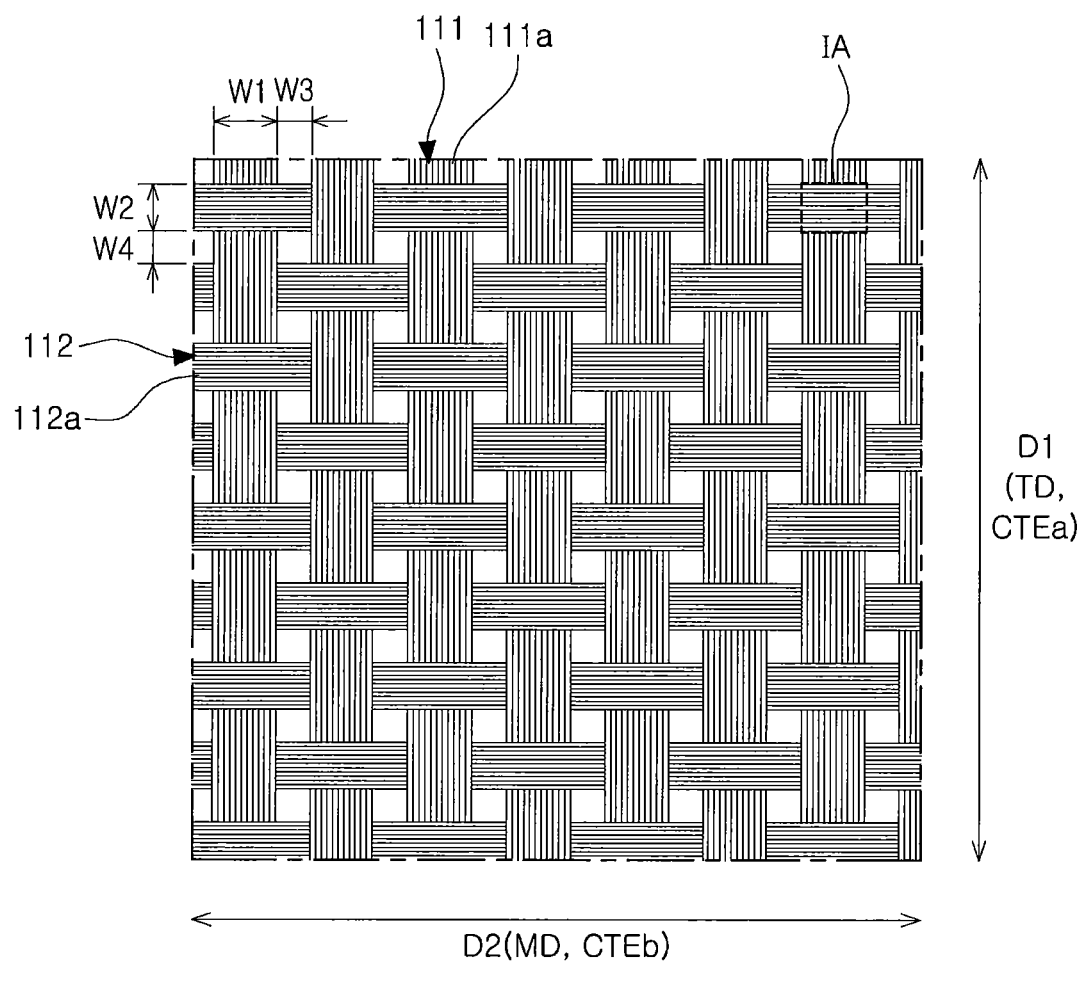
FIG. 5 is a view illustrating a weaving direction of a prepreg (PPG), according to an example embodiment.

FIG. 1 is a schematic perspective view of a semiconductor package, according to an example embodiment. FIG. 2 is a projected plan view of the semiconductor package in direction I of FIG. 1. FIG. 3 is a cross-sectional view taken along line II-II' of FIG. 2. FIG. 4 is an enlarged view of area A of FIG. 3. FIG. 5 is a view illustrating a weaving direction of a prepreg (PPG), according to an example embodiment.

Referring to FIG. 1, a semiconductor package 10, according to an example embodiment, may include a package substrate 100, first and second semiconductor chip stacks 200 and 300 mounted on the package substrate 100, and a molding 600 covering the first and second semiconductor chip stacks 200 and 300. The semiconductor package 10 may further include an external connection terminal 700 disposed on a lower surface thereof. An example embodiment illustrates the first and second semiconductor chip stacks 200 and 300 connected to the package substrate 100 by wires 501 to 504 (FIG. 2) by way of example. However, the present inventive concept is not limited thereto. The first and second semiconductor chip stacks 200 and 300 may also be directly connected to the package substrate 100 without a wire. Further, the external connection terminal 700 may include any one of a solder ball, a solder pad, a solder land, a metal bump, or a pillar. In the present example embodiment, the external connection terminal 700 may be a solder ball.

Referring to FIGS. 2 through 4, the package substrate 100 may include a circuit layer 130 and first and second prepregs 110 and 120 forming a stack structure with the circuit layer 130. The package substrate 100 may have an insulating resin layer 140 disposed on at least one surface thereof to protect an external surface of the package substrate 100, and may further include connection pads 131a for bonding the wires 501 to 504 to the first and second semiconductor chip stacks 200 and 300.

Figure 6A:
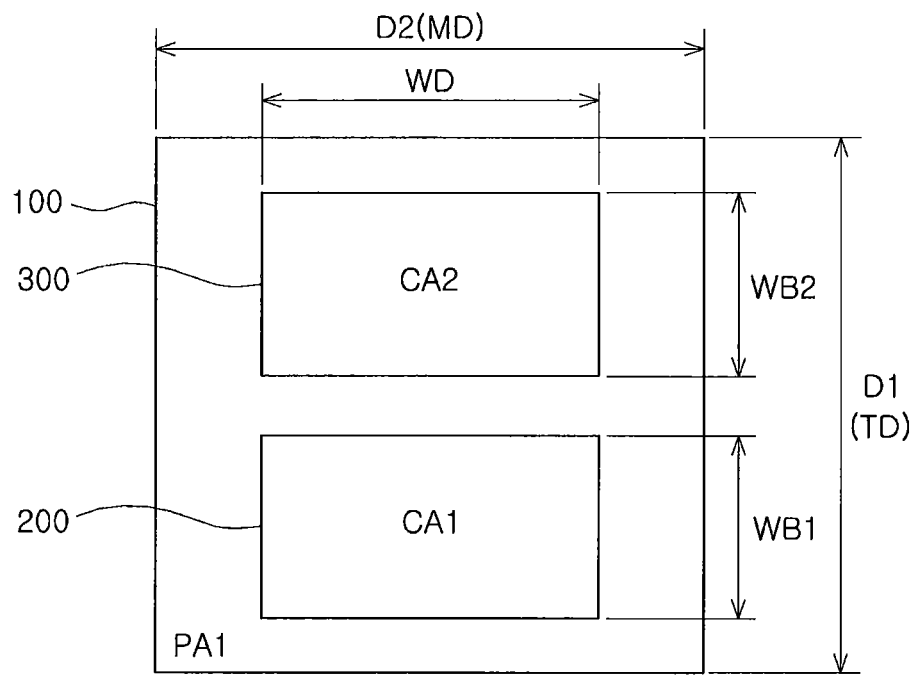
FIGS. 6A and 6B are views illustrating regions in which semiconductor chips may be mounted on substrates.

Referring to FIG. 3, the package substrate 100 may have a first surface S1 on which the first and second semiconductor chip stacks 200 and 300 may be mounted, and a second surface S2 opposing the first surface S1. Referring to FIG. 6A, the first surface S1 of the package substrate 100 may have a first region CA1 and CA2 in which the first and second semiconductor chip stacks 200 and 300 may be mounted, and a second region PA1 outside or surrounding the first region CA1 and CA2. The package substrate 100 may be a rigid printed circuit board, a flexible printed circuit board, or a rigid-flexible printed circuit board. The package substrate 100 may include a single layer printed circuit board or a multilayer printed circuit board.

The circuit layer 130 may be formed of or include a conductive material, such as a copper foil, and may include external circuit layers 131 and 133 disposed on the first and second prepregs 110 and 120, respectively, and an internal circuit layer 132 disposed between the first and second prepregs 110 and 120.

The first and second prepregs 110 and 120 may be formed by impregnating, with an epoxy resin 113 or the like, a fiber layer having a fabric sheet shape, such as glass fiber fabric, woven with a glass yarn, and thermally compressing the fiber layer with the epoxy resin. However, the present inventive concept is not limited thereto. According to example embodiments, a fiber layer having a fabric sheet shape, woven with a carbon fiber yarn, may also be applied. The prepreg may include a plurality of prepregs, which may be stacked in a thickness direction of the package substrate 100. In an example embodiment, the prepreg may include the first and second prepregs 110 and 120. However, the present inventive concept is not limited thereto. The prepreg may include a single layer or prepreg, and may also include three or more layers or prepregs. Further, the epoxy resin of the first and second prepregs 110 and 120 may include a filler, such as alumina or silica, to adjust a coefficient of thermal expansion (CTE) of the package substrate 100.

FIG. 5 is a view of a weaving arrangement or type of glass fabric included in the first prepreg 110. The glass fabric may be formed by weaving a plurality of first fibers 111 arranged in a first direction D1 and a plurality of second fibers 112 arranged in a second direction D2. The first and second fibers 111 and 112 may be the glass yarns described above, each of which may include a bunch of or plurality of filaments 111a or 112a, e.g., long-glass fibers. As illustrated in FIG. 5, the first and second fibers 111 and 112 may intersect each other upwardly and downwardly on a one-on-one basis. For example, one of the first fibers 111 may alternate between being above one of the second fibers 112 and below an adjacent one of the second fibers 112. Likewise, one of the second fibers 112 may alternate between being above one of the first fibers 111 and below an adjacent one of the first fibers 111. However, the present inventive concept is not limited thereto. The first and second fibers 111 and 112 may also intersect each other in units of the first and second fibers 111 and 112.

The first fibers 111 may be formed of or include filling yarns and the second fibers 112 may be formed of or include warp yarns, so that the filling yarns may be arranged in the first direction D1 of the glass fabric and the warp yarns may be arranged in the second direction D2 of the glass fabric. Hereinafter, a direction in which the filling yarns may be arranged may be defined as a filling yarn direction TD and a direction in which the warp yarns may be arranged may be defined as a warp yarn direction MD.

The first and second fibers 111 and 112 may be woven to have a plurality of intersection regions IA arranged in a matrix. The second fibers 112, e.g., the warp yarns, may be woven while being pulled by tensile force greater than that used for the first fibers 111, e.g., the filling yarns, in a weaving process. Thus, a width W2 of each of the second fibers 112 may be less than a width W1 of each of the first fibers 111. Further, the warp yarns may be pulled by relatively high tensile force than that used for the filling yarns. Thus, even when the warp yarns are heated, an increase in width of each of the warp yarns may be less than a width or increase of width of each of the filling yarns. This may cause a CTE of the filling yarns to be greater than that of the warp yarns. Thus, when the prepreg including the glass fabric woven with the filling yarns and the warp yarns is heated to a high temperature, an increase in width of the prepreg in the direction in which the filling yarns may be arranged may be greater than an increase of width of the prepreg in the direction in which the warp yarns may be arranged.

Warpage that may occur in the semiconductor package 10 may be influenced by such a difference between the CTEs in the filling yarn direction TD and the warp yarn direction MD of the package substrate 100. In general, a semiconductor package may undergo heating and cooling, such as molding and curing, cooling after attaching a solder ball, or cooling after mounting a semiconductor chip. While the semiconductor package undergoes such a process, warpage may occur in the semiconductor package due to CTE non-uniformity thereof. Further, the semiconductor chip may be mounted in the semiconductor package while being warped during a manufacturing process of the semiconductor package. When the semiconductor package and the semiconductor chip are warped in different directions, durability of the semiconductor package may be degraded. Thus, it may be advantageous to allow the semiconductor package and the semiconductor chip to warp in the same direction even when warpage occurs in order to improve or increase durability of the semiconductor package. In an example embodiment, arrangements of the filling yarn direction TD and the warp yarn direction MD of the package substrate 100 of the semiconductor package 10 may be adjusted to reduce warpage of the semiconductor package 10 and to further allow the semiconductor package 10 and a semiconductor chip to warp in the same direction even when warpage occurs. Hereinafter, a process of forming a molding during a process causing warpage to occur in the semiconductor package will be primarily described. Reducing warpage that may occur in other processes may also be undertaken by a configuration similar to that used in reducing warpage that may occur in the process of forming the molding. In the interest of brevity, a description of the configuration in such other processes will be omitted to avoid repeated descriptions.

The first and second fibers 111 and 112 may be disposed such that the width W1 of the first fiber 111 in the intersection region IA may be 1.1 or more times greater than the width W2 of the second fiber 112 in the intersection region IA. In an example embodiment, the first and second fibers 111 and 112 may be disposed such that the widths W1 and W2 thereof may be substantially the same. Thus, the intersection regions IA may be square or substantially square. Such an arrangement may also be obtained by adjusting the numbers of the first and second filaments 111a and 112a forming the first and second fibers 111 and 112, respectively. For example, the number of the second filaments 112a forming the second fiber 112 may be greater than that of the first filaments 111a forming the first fiber 111, and thus the first and second fibers 111 and 112 may be disposed such that the width W1 of the first fiber 111 may be substantially the same as the width W2 of the second fiber 112. As a result, the difference between the CTEs in the filling yarn direction TD and the warp yarn direction MD may be reduced.

The first fibers 111 may be spaced apart from each other by a first distance W3 and may extend parallel to each other, and the second fibers 112 may be spaced apart from each other by a second distance W4 and may extend parallel to each other. The first and second fibers 111 and 112 may also be disposed such that the first distance W3 may be less than or shorter than the second distance W4.

Figure 7A:
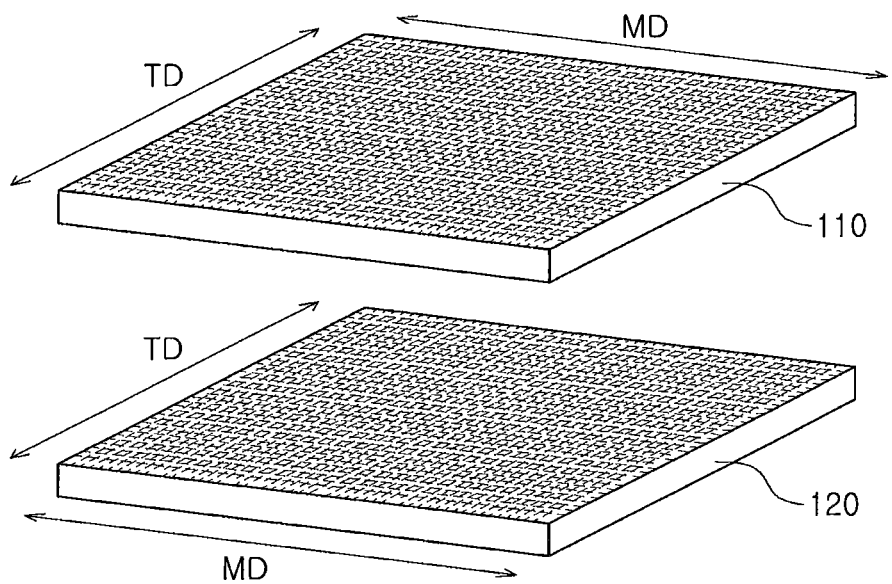
FIG. 7A is a view illustrating a stacking direction of a PPG, according to an example embodiment.
Figure 7B:
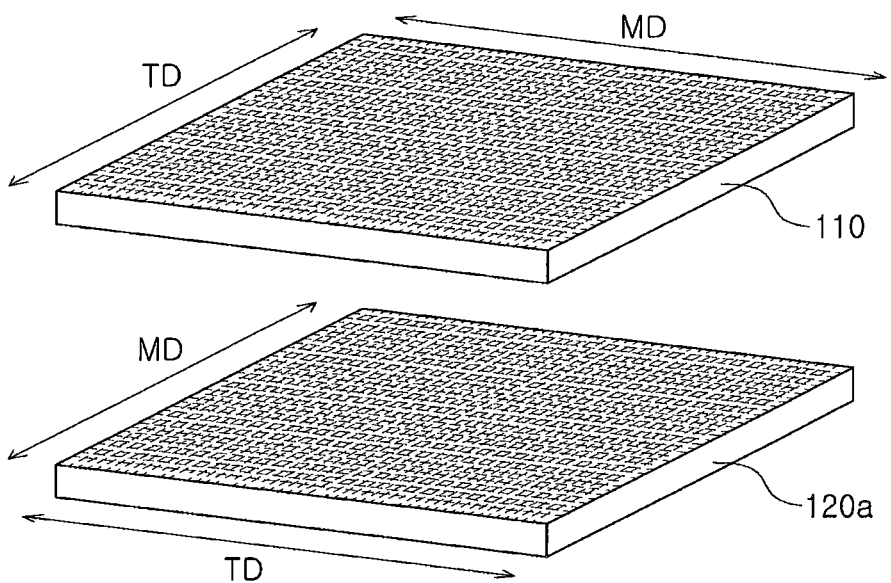
FIG. 7B is a modified example of FIG. 7A.

When the prepreg includes a plurality of prepregs, the filling yarn direction TD and the warp yarn direction MD of each of the prepregs may be the same as each other or may be different. FIGS. 7A and 7B illustrate the prepregs each including the first and second prepregs 110 and 120 (or 120a) as examples. FIG. 7A illustrates the first and second prepregs 110 and 120 of which the filling yarn direction TD and the warp yarn direction MD may be the same as each other. The first and second prepregs 110 and 120 may be disposed such that corresponding regions thereof may have substantially the same CTE. FIG. 7B illustrates the first and second prepregs 110 and 120a of which the filling yarn direction TD and the warp yarn direction MD may be different from each other. The difference between the CTEs of the first and second prepregs 110 and 120a may be compensated, thus reducing CTE non-uniformity of the package substrate 100.

Referring to FIGS. 2 and 3, the first semiconductor chip stack 200 mounted on the package substrate 100 may be formed by stacking a plurality of semiconductor chips 210 and 220, and the second semiconductor chip stack 300 mounted on the package substrate 100 may be formed by stacking a plurality of semiconductor chips 310 and 320. The first and second semiconductor chip stacks 200 and 300 may be bonded to the package substrate 100 by a die adhesive film (DAF) 401. Further, each of the semiconductor chips 210 and 220 included in the first semiconductor chip stack 200 and the semiconductor chips 310 and 320 included in the second semiconductor chip stack 300 may be bonded by a DAF 402.

Each of the semiconductor chips 210, 220, 310, and 320 may include a memory chip or an application processor. In an example embodiment, the first or second semiconductor chip stack 200 or 300 may include a configuration in which a memory chip may be stacked on an application processor. The semiconductor chips 210, 220, 310, and 320 may be electrically connected to the connection pads 131a of the package substrate 100, e.g., using the wires 501 to 504. The wires 501 to 504 may include copper (Cu), gold (Au), or aluminum (Al).

Referring to FIG. 6A, the package substrate 100 may have the first region CA1 and CA2 in which the first and second semiconductor chip stacks 200 and 300 may be mounted, and the second region PA1 outside or surrounding the first region CA1 and CA2. The first region CA1 and CA2 in which the first and second semiconductor chip stacks 200 and 300 may be mounted may include a plurality of divided regions CA1 and CA2, according to the number of the first and second semiconductor chip stacks 200 and 300. The divided regions CA1 and CA2 may have substantially the same area as each other, and may extend in the second direction D2 to be parallel to each other. In an example embodiment, the first region CA1 and CA2 may include two divided regions.

The first region CA1 and CA2 may be disposed such that a length direction WB1+WB2 of the total area CA1+CA2 may be the same as the filling yarn direction TD of the package substrate 100. A length dimension WB1+WB2 of the total area CA1+CA2 may extend in the filling yarn direction TD of the package substrate 100. A length direction or dimension of the total area of the first region CA1 and CA2 may refer to the length direction or dimension WB1+WB2, a combination of the first region CA1 and CA2, rather than a length direction or dimension of each of the first region CA1 and CA2 in which the semiconductor chips 210, 220, 310, and 320 may be mounted. As illustrated in FIG. 6A, one direction or dimension WD of the first region CA1 and CA2 in which the first and second semiconductor chip stacks 200 and 300 may be mounted may be less than the sum of other directions or dimensions WB1 and WB2. Thus, the other directions or dimensions WB1 and WB2 may correspond to the length direction or dimension of the first region CA1 and CA2 in which the first and second semiconductor chip stacks 200 and 300 may be mounted, and the one direction WD may correspond to a width direction or dimension of the first region CA1 and CA2.

The first region CA1 and CA2, in which the first and second semiconductor chip stacks 200 and 300 may be mounted, of the package substrate 100 may have a CTE relatively less than that of the second region PA1 due to the first and second semiconductor chip stacks 200 and 300. Thus, a CTE of a portion of the package substrate 100 in which a ratio of the first region CA1 and CA2 having the first and second semiconductor chip stacks 200 and 300 mounted therein may be high in both of the first and second directions D1 and D2 of the package substrate 100, may be relatively less than a CTE of a remaining portion.

Figure 6B:
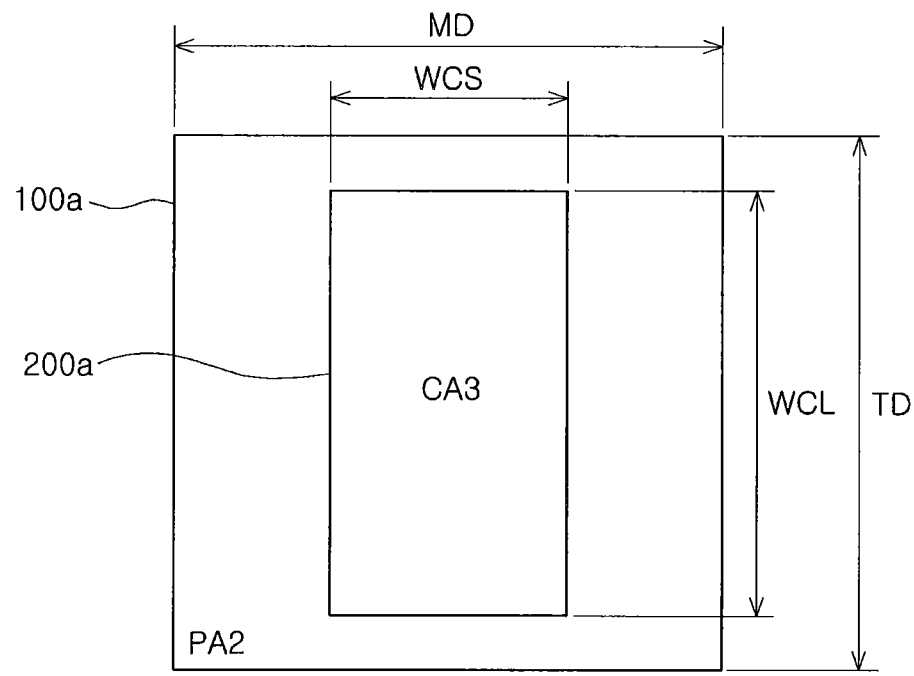

Thus, the filling yarn direction TD of the package substrate 100 may be defined as a direction in which the ratio of the region having the first and second semiconductor chip stacks 200 and 300 mounted therein may be high, and the warp yarn direction MD of the package substrate 100 may be defined as a direction in which the ratio of the region having the first and second semiconductor chip stacks 200 and 300 mounted therein may be low. As a result, CTE non-uniformity of the semiconductor package 10 that may occur due to the first region CA1 and CA2 having a CTE relatively less than that of the second region PA1 may be reduced. Further, warpage of the semiconductor package 10 that may occur due to the CTE non-uniformity of the semiconductor package 10 may also be reduced. FIG. 6B is a modified example of FIG. 6A, and illustrates a semiconductor chip stack 200a mounted on a package substrate 100a as an example. A filling yarn direction TD of the package substrate 100a may correspond to or be defined as a length direction or dimension WCL of a region CA3 in which the semiconductor chip stack 200a may be mounted and a warp yarn direction MD of the package substrate 100a may correspond to or be defined as a width direction or dimension WCS of the region CA3 in which the semiconductor chip stack 200a may be mounted, to reduce CTE non-uniformity of a semiconductor package, thus reducing warpage of the semiconductor package.

Referring to FIG. 1, the molding 600 may be disposed on the package substrate 100 to cover an upper surface and side surfaces of each of the first and second semiconductor chip stacks 200 and 300. The molding 600 may cover the wires 501 to 504. In an example embodiment, the molding 600 may be formed of or include a material including an epoxy molding compound (EMC).

In the process of forming and curing the molding 600, warpage may occur in the semiconductor package 10 due to a difference between a CTE of the molding 600 and that of the package substrate 100. In general, in a process of cooling the semiconductor package 10 for curing the semiconductor package 10, a size of the molding 600 contracted (or an amount the molding 600 contracts) may be greater than a size of the package substrate 100 contracted (or an amount the package substrate 100 contracts). Thus, a peripheral region of the semiconductor package 10 may be downwardly bent. In an example embodiment, the difference between the CTEs of the molding 600 and the package substrate 100 may be reduced to lessen warpage of the semiconductor package 10, and even when warpage occurs in the semiconductor package 10, the molding 600 may be allowed to warp in the same direction as a direction in which the semiconductor chip may be warped, thus increasing durability of the semiconductor package 10. This will be described below.

In the semiconductor package 10 having the above-mentioned structure, the length direction or dimension of the entire region in which the first and second semiconductor chip stacks 200 and 300 may be mounted may correspond to or be defined as the filling yarn direction TD of the package substrate 100. The portion of the package substrate 100, in which the first and second semiconductor chip stacks 200 and 300 may be mounted, may have a CTE relatively less than that of the remaining portion of the package substrate 100. Thus, an elongated portion of the entire region, in which the first and second semiconductor chip stacks 200 and 300 may be mounted, may be disposed in the filling yarn direction TD in which the CTE may be relatively high, to increase a balance among the CTEs of the respective regions of the semiconductor package 10, thus reducing a magnitude of warpage that may occur in the semiconductor package 10. Hereinafter, an effect of a semiconductor package, according to an example embodiment, will be described in contrast to a comparative example embodiment.

Referring to FIGS. 8A to 12, warpages of semiconductor packages at high temperatures, according to an example embodiment and a comparative example embodiment, may be compared.

Figure 8A:
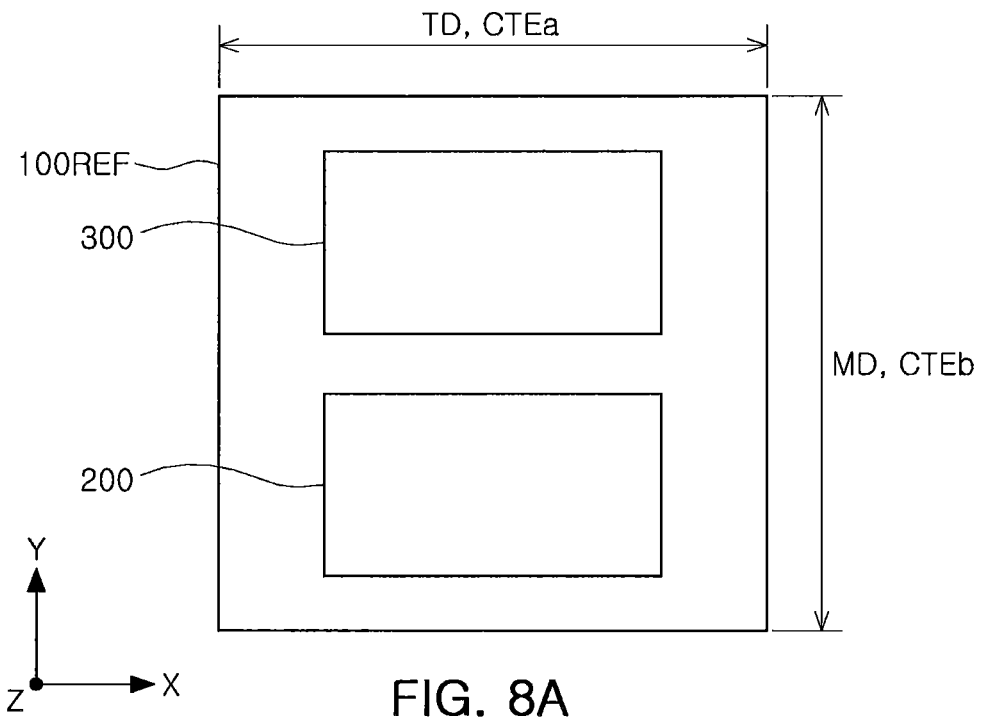
FIGS. 8A and 8B are plan views of semiconductor packages, according to an example embodiment and a comparative example embodiment.
Figure 8B:
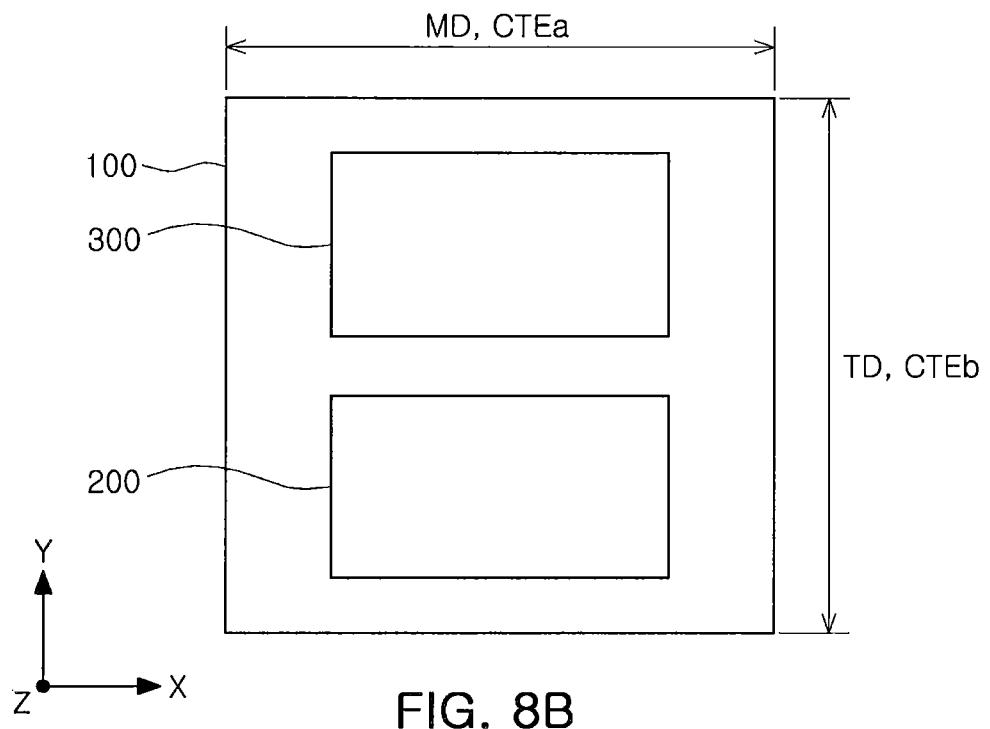
Figure 9A:
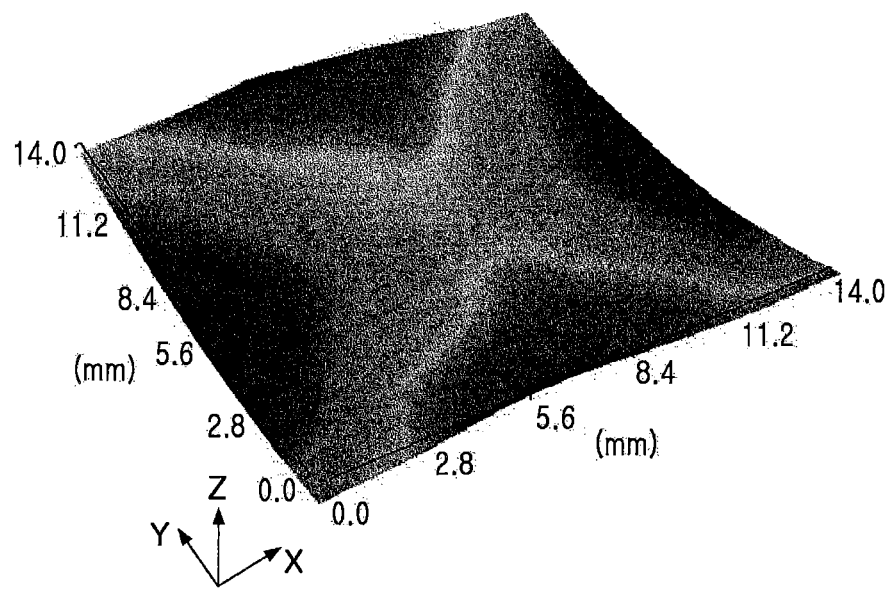
FIGS. 9A and 9B are views illustrating the shapes of warpages of semiconductor packages, according to an example embodiment and a comparative example embodiment.
Figure 9B:
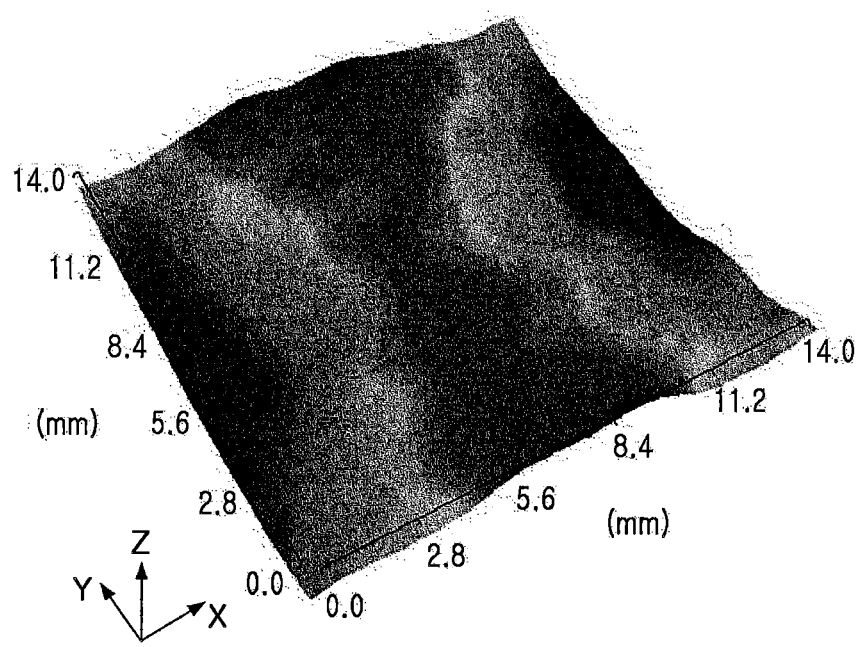
Figure 10A:
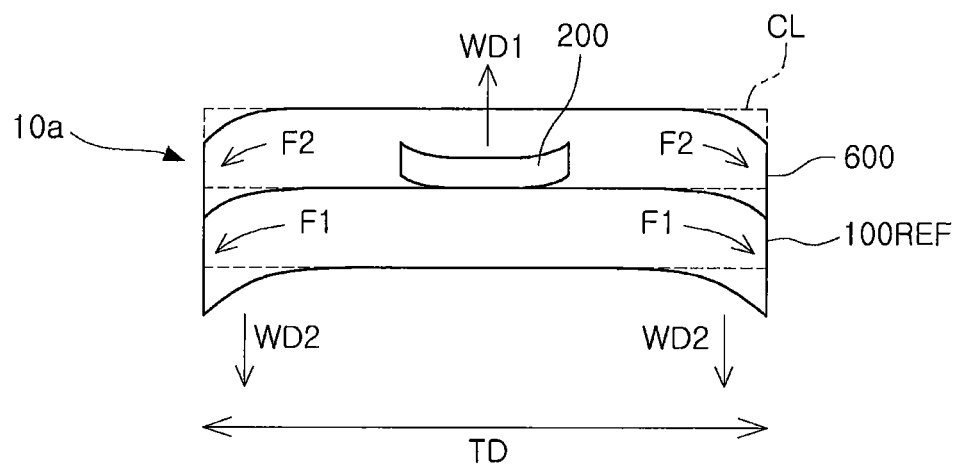
FIGS. 10A and 10B are cross-sectional views illustrating directions of warpages of semiconductor packages, according to an example embodiment and a comparative example embodiment.
Figure 10B:
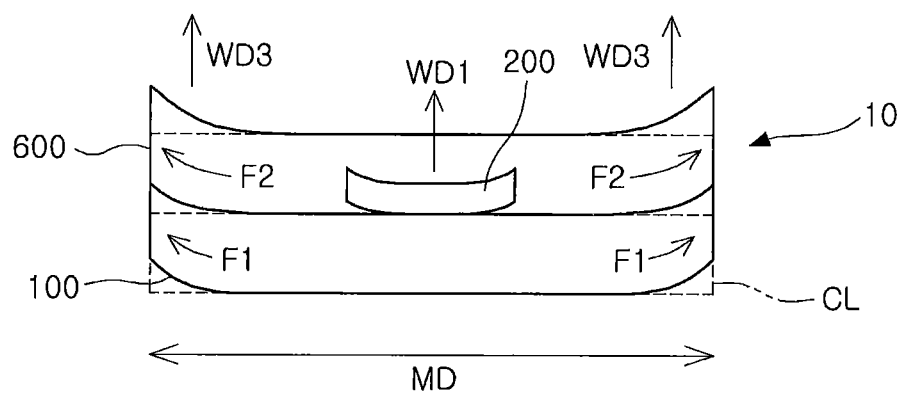
Figure 11:
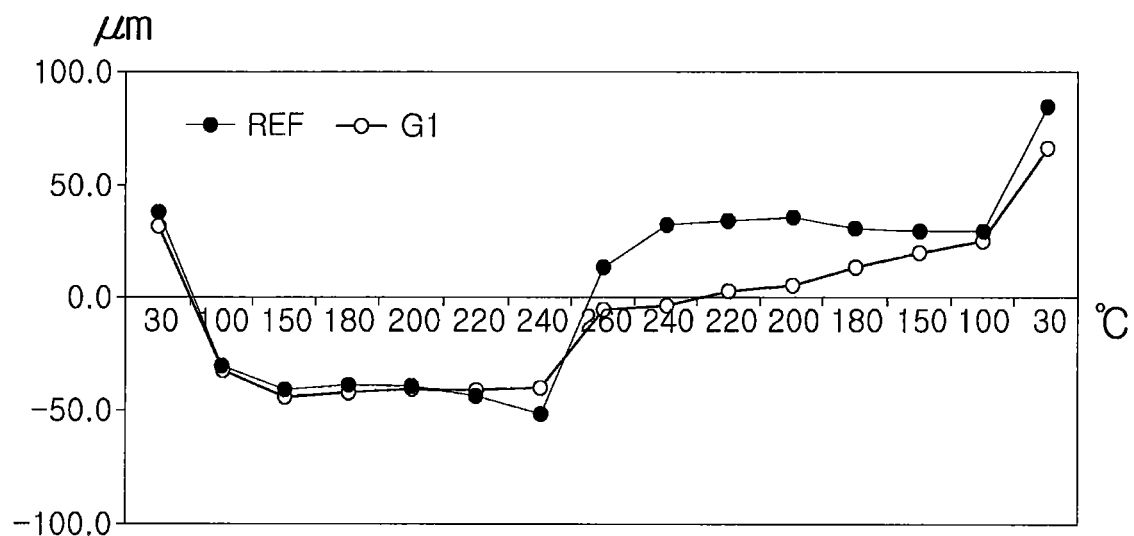
FIG. 11 is a graph in which degrees of warpages of semiconductor packages, according to an example embodiment and a comparative example embodiment, are compared.
Figure 12:
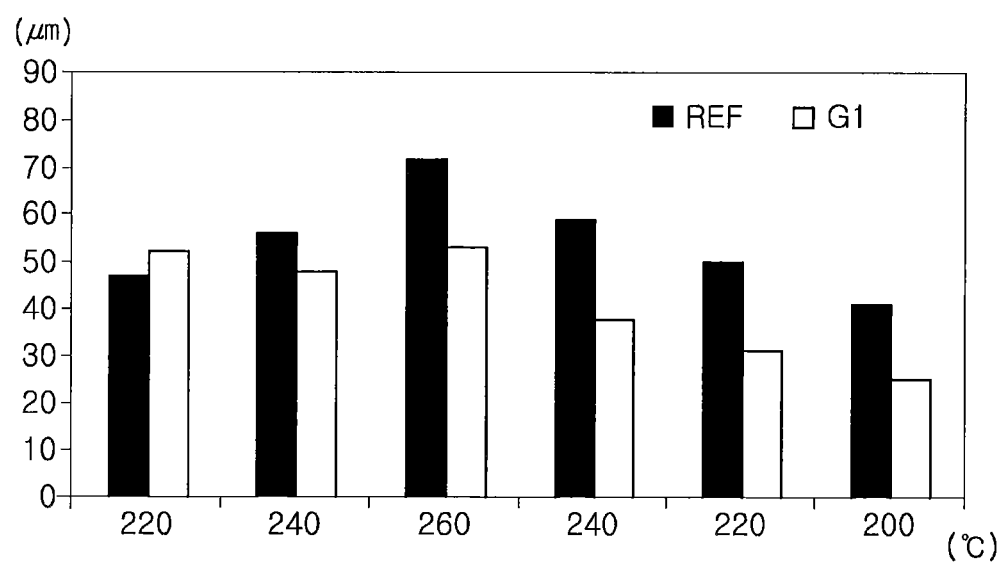
FIG. 12 is a graph in which magnitudes of warpages of semiconductor packages, according to an example embodiment and a comparative example embodiment, are compared.

FIGS. 8A and 8B are plan views of semiconductor packages, according to an example embodiment and a comparative example embodiment. FIGS. 9A and 9B are views illustrating the shapes of warpages of semiconductor packages, according to an example embodiment and a comparative example embodiment. FIGS. 10A and 10B are cross-sectional views illustrating directions of warpages of semiconductor packages, according to an example embodiment and a comparative example embodiment. FIG. 11 is a graph in which degrees of warpages of semiconductor packages, according to an example embodiment and a comparative example embodiment, are compared. FIG. 12 is a graph in which magnitudes of warpages of semiconductor packages, according to an example embodiment and a comparative example embodiment, are compared.

The comparative example embodiment may differ from the example embodiment in that a package substrate 100REF may be employed, in which the filling yarn direction TD and the warp yarn direction MD of the package substrate 100, according to the example embodiment, may be reversed.

Thus, as illustrated in FIG. 8B, in the semiconductor package, according to the example embodiment, the warp yarn direction MD of the package substrate 100 may be defined as a direction in which a portion of the package substrate 100 having the first and second semiconductor chip stacks 200 and 300 mounted thereon may be relatively small, for example, in a direction CTEa in which the CTE may be relatively high, and the filling yarn direction TD of the package substrate 100 may be defined as a direction CTEb in which the CTE may be relatively low. In contrast, as illustrated in FIG. 8A, the comparative example embodiment may differ from the example embodiment in that the filling yarn direction TD of the package substrate 100 may be defined as the direction in which the portion of the package substrate 100 having the first and second semiconductor chip stacks 200 and 300 mounted thereon may be relatively small, for example, in the direction CTEa in which the CTE may be relatively high.

Referring to FIG. 9A, in the semiconductor package, according to the comparative example embodiment, the filling yarn direction TD of the package substrate 100REF may be defined as the direction CTEa in which the CTE may be relatively high, so that the direction in which the CTE may be relatively high may be equivalent to the portion of the package substrate 100REF in which the CTE may be relatively high. Thus, as illustrated in FIG. 10A, in the process of cooling the molding 600, force F1 by which the package substrate 100REF may be contracted may be greater than or superior to force F2 by which the molding 600 may be contracted, so that warpage WD2 may occur downwardly from the entirety of a semiconductor package 10a. The warpage WD2 may occur in a direction opposite to that of warpage WD1 that may occur in the first semiconductor chip stack 200, which may cause durability of the semiconductor package 10a to be degraded. Reference denotation CL is a reference line indicating the semiconductor package 10a in which warpage does not occur.

In contrast, referring to FIG. 9B, in the semiconductor package, according to the example embodiment, the warp yarn direction MD of the package substrate 100 may be defined as the direction CTEa in which the CTE may be relatively high, so that the direction in which the CTE may be relatively high may not be equivalent to the portion of the package substrate 100 in which the CTE may be relatively high. Thus, as illustrated in FIG. 10B, force F2 by which the molding 600 may be contracted may be greater than or superior to force F1 by which the package substrate 100 may be contracted, so that warpage WD3 may occur upwardly from the entirety of the semiconductor package 10. The warpage WD3 may occur in the same direction as that of the warpage WD1 that may occur in the first semiconductor chip stack 200, which may cause durability of the semiconductor package 10 to be improved, in comparison to the comparative example embodiment.

FIG. 11 is a graph in which temperatures applied to an example embodiment G1 and a comparative example embodiment REF and averages (urn) of warpages at the temperature may be arranged in the manufacturing process order. In the comparative example embodiment REF, when the temperature rises from 240° C. to 260° C., the warpage may rapidly increase, and until the temperature drops to room temperature (30° C.), the warpage may continue to be maintained. In contrast, the warpage of the example embodiment G1 may be reduced at the same temperatures. Table 1 below illustrates the averages of the warpages at the respective temperatures in the example embodiment G1 and the comparative example embodiment REF of FIG. 11. The warpage of the example embodiment G1 may be reduced compared to that of the comparative example embodiment REF.

TABLE 1

| Temperature (° C.) | REF (um) | G1 (um) |
|---|---|---|
| 30 | 38.5 | 33.0 |
| 100 | −29.7 | −31.3 |
| 150 | −39.9 | −43.3 |
| 180 | −39.1 | −41.2 |
| 200 | −38.9 | −39.9 |
| 220 | −43.0 | −40.3 |
| 240 | −51.1 | −39.0 |
| 260 | 14.5 | −4.2 |
| 240 | 32.3 | −2.7 |
| 220 | 34.5 | 3.7 |
| 200 | 36.0 | 6.2 |
| 180 | 31.0 | 14.0 |
| 150 | 29.5 | 20.7 |
| 100 | 30.0 | 25.9 |
| 30 | 85.1 | 67.2 |

FIG. 12 is a graph in which temperatures applied to the example embodiment G1 and the comparative example embodiment REF in a high temperature state and significantly increased values of warpages at the temperature may be arranged in the manufacturing process order. Over the entire range of high temperatures, an absolute value of warpage of the comparative example embodiment REF may be greater than that of warpage of the example embodiment G1, and particularly, from 260° C., a difference of about 20 um between the absolute values of the warpages in the example embodiment G1 and the comparative example embodiment REF may be maintained. Table 2 below illustrates the significantly increased values of the warpages at the respective temperatures in the example embodiment G1 and the comparative example embodiment REF of FIG. 12 throughout the manufacturing process. The significantly increased value of the warpage of the example embodiment G1 may be reduced compared to that of the warpage of the comparative example embodiment REF.

TABLE 2

| Temperature (° C.) | REF (um) | G1 (um) |
|---|---|---|
| 30 | 55 | 44 |
| 100 | 43 | 49 |
| 150 | 45 | 63 |
| 180 | 43 | 53 |
| 200 | 43 | 50 |
| 220 | 47 | 52 |
| 240 | 56 | 48 |
| 260 | 72 | 53 |
| 240 | 59 | 38 |
| 220 | 50 | 31 |
| 200 | 41 | 25 |
| 180 | 37 | 27 |
| 150 | 40 | 38 |
| 100 | 44 | 44 |
| 30 | 111 | 75 |

Figure 13:
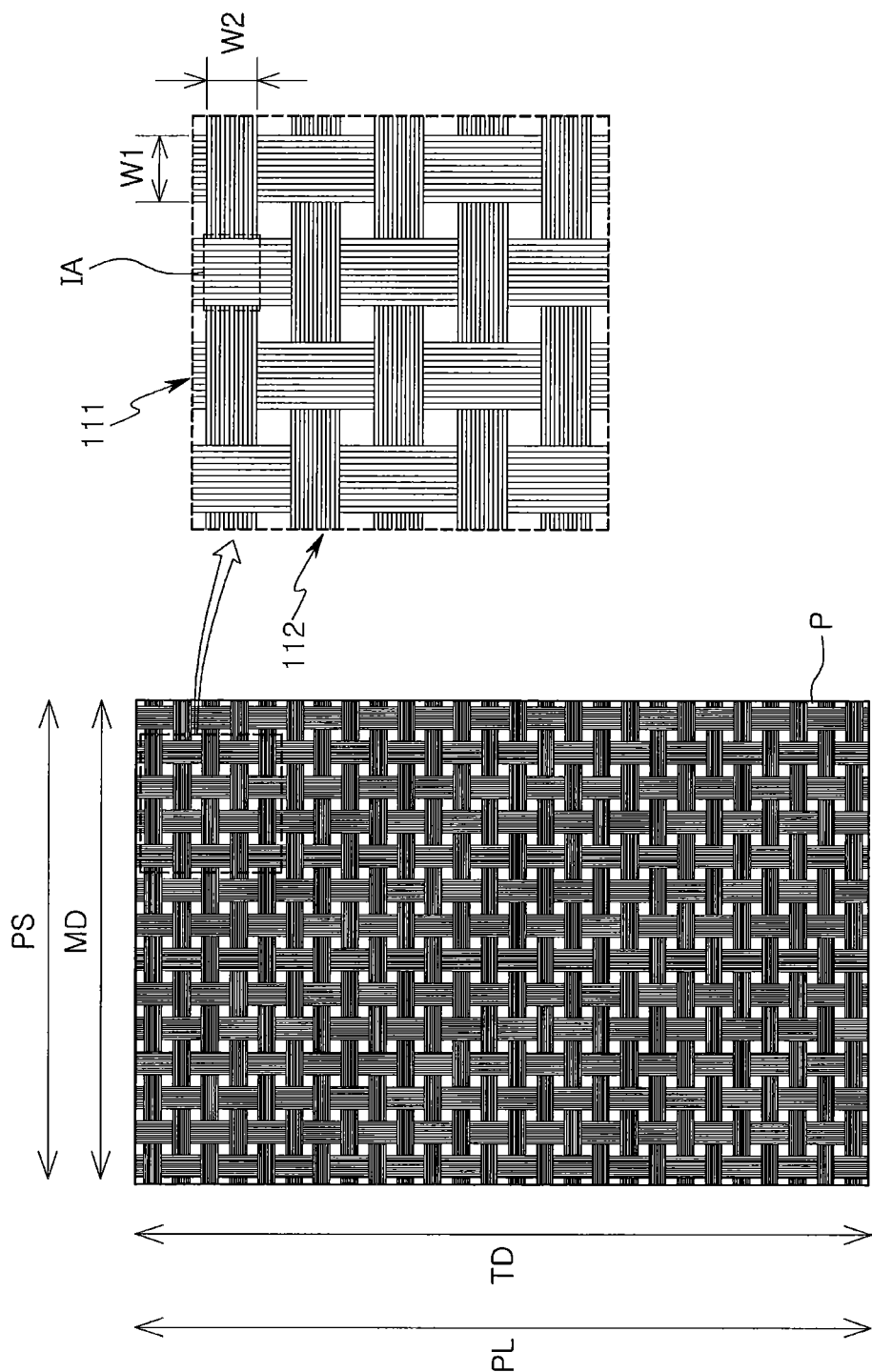
FIGS. 13 and 14 are schematic plan views illustrating primary manufacturing processes of manufacturing the semiconductor package of FIG. 1, using a circuit board, according to an example embodiment.
Figure 14:
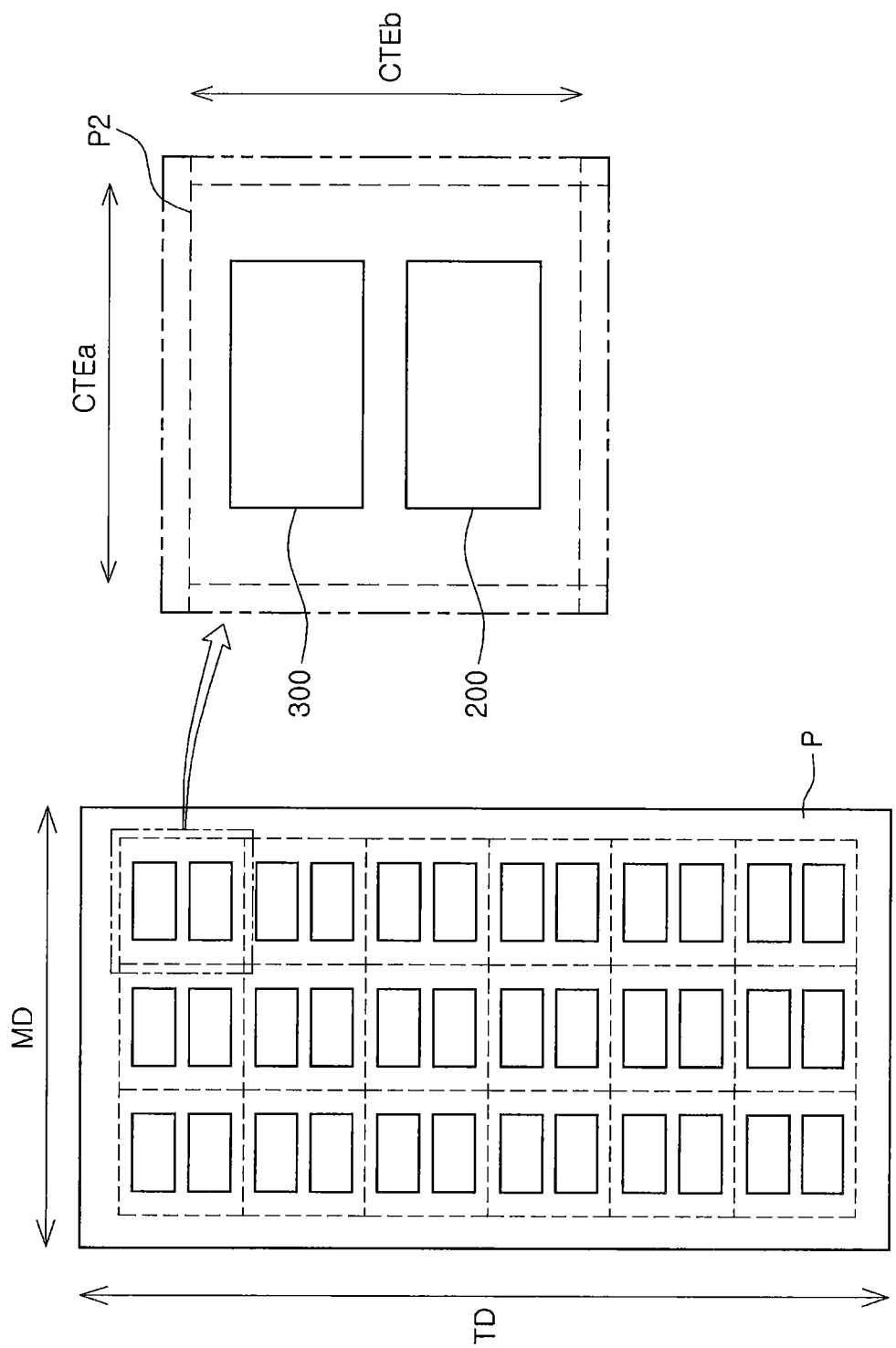

Hereinafter, manufacturing processes of a circuit board and a semiconductor package using the same, according to an example embodiment, will be described. FIGS. 13 and 14 are schematic plan views illustrating primary manufacturing processes of manufacturing the semiconductor package of FIG. 1, using the circuit board, according to an example embodiment. The circuit board, according to an example embodiment, may be provided to manufacture the package substrate described above. The semiconductor package may be manufactured by mounting a semiconductor chip stack on the circuit board, forming a molding thereon, and dividing the semiconductor chip stack into individual semiconductor chips. The above-described package substrate may correspond to a division of the circuit board. Thus, the same description as that of the package substrate of the descriptions of the circuit board will be omitted to avoid repeated descriptions.

Referring first to FIG. 13, a circuit board P may be provided to manufacture the package substrate of the semiconductor package. The circuit board P may have a structure in which at least one prepreg and a circuit layer may be stacked. The prepreg may be formed by impregnating, with an epoxy resin or the like, a fiber layer having a fabric sheet shape, such as glass fiber fabric, woven with a glass yarn and thermally compressing the fiber layer with the epoxy resin.

In detail, as illustrated in FIG. 13, the circuit board P may have the shape of a plate elongated in a length direction PL. As described above for the package substrate, the circuit board P may include at least one prepreg, which may include a fiber layer woven with a plurality of first fibers 111 arranged in the length direction PL of the circuit board P and a plurality of second fibers 112 arranged in a width direction PS of the circuit board P substantially perpendicular to the length direction PL. Each of the first fibers 111 may be formed of or include a filling yarn, and each of the second fibers 112 may be formed of or include a warp yarn. Thus, in the circuit board P, the length direction PL may correspond to or be defined as a filling yarn direction TD, and the width direction PS may correspond to or be defined as a warp yarn direction MD.

Similar to those described above on the package substrate, the first fibers 111 and the second fibers 112 may be woven to have a plurality of intersection regions IA arranged in a matrix. Since the first fiber 111 may be formed of or include the filling yarn and the second fiber 112 may be formed of or include the warp yarn, a width W1 of the first fiber 111 may be greater than a width W2 of the second fiber 112. Thus, in each of the intersection regions IA, a size of the intersection region IA in the length direction PL may correspond to the width W2 of the second fiber 112, and a size of the intersection region IA in the width direction PS may correspond to the width W1 of the first fiber 111, so that the size of the intersection region IA in the length direction PL may be smaller than that of the intersection region IA in the width direction PS.

Further, as described above for the package substrate, the circuit layer may be disposed on at least one of opposite surfaces of the prepreg.

Subsequently, as illustrated in FIG. 14, first and second semiconductor chip stacks 200 and 300 may be mounted in each of individual semiconductor chip mounting regions P2 of the circuit board P, such that a length direction CTEb of a combination of regions, in which the first and second semiconductor chip stacks 200 and 300 may be mounted, may correspond to or be defined as the filling yarn direction TD of the circuit board P. As described above, the regions in which the first and second semiconductor chip stacks 200 and 300 may be mounted may have a CTE relatively less than that of a remaining region outside the regions. Thus, when the length direction CTEb of the combination of regions, in which the first and second semiconductor chip stacks 200 and 300 may be mounted, is defined as the filling yarn direction TD, a width of the circuit board P increased in the filling yarn direction TD in which a CTE of the circuit board P may be relatively high may be reduced.

The circuit board may be exposed to high temperatures in a process of heating and cooling, such as molding and curing, cooling after attaching a solder ball, or cooling after mounting a semiconductor chip, during the semiconductor package manufacturing process. Thus, the circuit board may be thermally expanded. The width of the circuit board in the direction in which the CTE thereof may be relatively high may be increased further than that of the circuit board in the direction in which the CTE thereof may be relatively low. Thus, a larger amount of warpage may occur in the direction in which the CTE of the circuit board may be relatively high. In an example embodiment, a larger number of semiconductor chip mounting regions having a relatively low CTE may be disposed in the filling yarn direction TD having a relatively high CTE, thus reducing a difference between the CTEs in the direction having the relatively high CTE and the direction having the relatively low CTE. Further, even when warpage occurs in the semiconductor package, the semiconductor package may be allowed to warp upwardly as for the semiconductor chip, thus reducing non-uniformity of warpage that may occur in the semiconductor chip stack.

Subsequently, the molding may be applied to a surface of the package substrate 100 on which the first and second semiconductor chip stacks 200 and 300 may be mounted to cover the surface, and the circuit board P may be diced into individual semiconductor chip mounting regions P2. As a result, the semiconductor package of FIG. 1 may be manufactured.

As set forth above, according to example embodiments of the present inventive concept, a circuit board and a semiconductor package using the same may reduce warpage that may occur in the manufacturing process thereof.

While example embodiments have been shown and described above, it will be apparent to those skilled in the art that modifications and variations could be made without departing from the scope of the present inventive concept, as defined by the appended claims.

What is claimed is:

1. A circuit board comprising:
   at least one prepreg including a fiber layer, the fiber layer being woven with a plurality of first fibers arranged in a first direction and a plurality of second fibers arranged in a second direction that is substantially perpendicular to the first direction; and
   a circuit layer on at least one of opposite surfaces of the at least one prepreg,
   wherein the at least one prepreg has a length in the first direction greater than a length in the second direction, each of the plurality of first fibers comprises a filling yarn, and each of the plurality of second fibers comprises a warp yarn,
   wherein the at least one prepreg comprises a plurality of prepregs,
   wherein the plurality of first fibers and the plurality of second fibers are woven to have a plurality of intersection regions arranged in a matrix, and each of the plurality of intersection regions has a size in the first direction that is smaller than a size in the second direction.

2. The circuit board of claim 1, wherein a coefficient of thermal expansion of the at least one prepreg in the first direction is greater than a coefficient of thermal expansion of the at least one prepreg in the second direction.

3. The circuit board of claim 1, wherein each of the plurality of first fibers and the plurality of second fibers comprises a glass yarn.

4. The circuit board of claim 1, wherein each of the plurality of first fibers of each of the plurality of prepregs comprises a filling yarn, and each of the plurality of second fibers of each of the plurality of prepregs comprises a warp yarn.

5. The circuit board of claim 1, wherein a width of each of the plurality of first fibers is greater than a width of each of the plurality of second fibers.

6. The circuit board of claim 5, wherein the width of each of the plurality of first fibers is 1.1 or more times greater than the width of each of the plurality of second fibers.

7. The circuit board of claim 1, wherein each of the plurality of first fibers and each of the plurality of second fibers comprises a plurality of filaments, and a number of the plurality of filaments of each of the plurality of second fibers is greater than a number of the plurality of filaments of each of the plurality of first fibers.

8. The circuit board of claim 1, wherein the plurality of first fibers are spaced apart from one another by a first distance and extend parallel to each other, the plurality of second fibers are spaced apart from one another by a second distance and extend parallel to each other, and the first distance is less than the second distance.

9. A circuit board comprising:
at least one first prepreg including a first fiber layer, the first fiber layer being woven with a plurality of first fibers arranged in a first direction and a plurality of second fibers arranged in a second direction that is substantially perpendicular to the first direction;
at least one second prepreg including a second fiber layer, the second fiber layer being woven with a plurality of third fibers arranged in the first direction and a plurality of fourth fibers arranged in the second direction;
a circuit layer on at least one of opposite surfaces of the at least one first prepreg or the at least one second prepreg,
wherein the at least one first prepreg and the at least one second prepreg each have a length in the first direction greater than a length in the second direction, each of the plurality of first fibers comprises a filling yarn, each of the plurality of second fibers comprises a warp yarn, each of the plurality of third fibers comprises a warp yarn, and each of the plurality of fourth fibers comprises a filling yarn,
wherein the plurality of first fibers and the plurality of second fibers are woven to have a plurality of intersection regions arranged in a matrix, and each of the plurality of intersection regions has a size in the first direction that is smaller than a size in the second direction.

10. A semiconductor package comprising:
at least one semiconductor chip;
a package substrate having a first surface and an opposite second surface, the first surface having a first region in which the at least one semiconductor chip is mounted and a second region different from the first region; and
a molding encapsulating the at least one semiconductor chip on the first surface of the package substrate,
wherein the package substrate includes:
  at least one prepreg including a fiber layer, the fiber layer being woven with a plurality of first fibers arranged in a first direction and a plurality of second fibers arranged in a second direction that is substantially perpendicular to the first direction; and
  a circuit layer disposed on at least one of opposite surfaces of the at least one prepreg,
wherein the at least one prepreg has a length in the first direction greater than a length in the second direction, each of the plurality of first fibers comprises a filling yarn, each of the plurality of second fibers comprises a warp yarn, and the first region has a shape that is longer in the first direction than in the second direction,
wherein the at least one prepreg comprises a plurality of prepregs.

11. The semiconductor package of claim 10, wherein the plurality of first fibers and the plurality of second fibers are woven to have a plurality of intersection regions arranged in a matrix, and each of the plurality of intersection regions has a size in the first direction that is smaller than a size in the second direction.

12. The semiconductor package of claim 10, wherein a coefficient of thermal expansion of the at least one prepreg in the first direction is greater than a coefficient of thermal expansion of the at least one prepreg in the second direction.

13. The semiconductor package of claim 10, wherein the first region includes a plurality of regions that are spaced apart in the first direction.

14. The semiconductor package of claim 13, wherein each of the plurality of regions have substantially the same area.

15. The semiconductor package of claim 13, wherein the plurality of regions are parallel to each other in the second direction.

16. The semiconductor package of claim 10, wherein the at least one prepreg includes a fabric sheet having a resin coated and cured between the plurality of first fibers and the plurality of second fibers, and the circuit layer is thermally compressed with the fabric sheet.

17. The semiconductor package of claim 10, wherein corresponding regions of the plurality of prepregs have substantially the same coefficient of thermal expansion.

18. The semiconductor package of claim 10, wherein the plurality of prepregs are stacked in a thickness direction of the package substrate.

19. The semiconductor package of claim 10, wherein the molding comprises an epoxy molding compound (EMC).

20. The semiconductor package of claim 10, wherein:
each of the plurality of first fibers and each of the plurality of second fibers comprises a plurality of filaments, and a number of the plurality of filaments of each of the plurality of second fibers is greater than a number of the plurality of filaments of each of the plurality of first fibers; and/or
the plurality of first fibers are spaced apart from one another by a first distance and the plurality of second fibers are spaced apart from one another by a second distance, and the first distance is less than the second distance.

* * * * *